(12) United States Patent
Henson

(10) Patent No.: US 11,316,528 B2
(45) Date of Patent: Apr. 26, 2022

(54) PWM DAC WITH IMPROVED LINEARITY AND INSENSITIVITY TO SWITCH RESISTANCE

(71) Applicant: Fluke Corporation, Everett, WA (US)

(72) Inventor: Denny E. Henson, Everett, WA (US)

(73) Assignee: Fluke Corporation, Everett, WA (US)

( * ) Notice: Subject to any disclaimer, the term of this patent is extended or adjusted under 35 U.S.C. 154(b) by 0 days.

(21) Appl. No.: 17/154,849

(22) Filed: Jan. 21, 2021

(65) Prior Publication Data

US 2021/0234552 A1 Jul. 29, 2021

Related U.S. Application Data

(60) Provisional application No. 62/965,760, filed on Jan. 24, 2020.

(51) Int. Cl.
*H03M 1/82* (2006.01)
*H03F 3/217* (2006.01)
*H03K 7/08* (2006.01)
*H03M 1/18* (2006.01)

(52) U.S. Cl.
CPC .......... *H03M 1/822* (2013.01); *H03F 3/2175* (2013.01); *H03K 7/08* (2013.01); *H03M 1/183* (2013.01)

(58) Field of Classification Search
CPC ........ H03M 1/822; H03M 1/183; H03M 1/66; H03F 3/2175; H03F 1/56; H03K 7/08; H03K 5/08
USPC ................................................. 341/144–160
See application file for complete search history.

(56) References Cited

U.S. PATENT DOCUMENTS

| 5,402,082 | A | 3/1995 | Eccleston et al. | |
|---|---|---|---|---|
| 10,938,353 | B2* | 3/2021 | Ni | H03F 1/30 |
| 2007/0285076 | A1* | 12/2007 | Dequina | G05F 1/46 323/316 |
| 2008/0164857 | A1* | 7/2008 | Dequina | G05F 1/46 323/280 |
| 2009/0184854 | A1 | 7/2009 | Trumbo et al. | |
| 2020/0313627 | A1* | 10/2020 | Ni | H03F 3/45475 |
| 2021/0226591 | A1* | 7/2021 | Lin | H03F 3/2173 |

(Continued)

OTHER PUBLICATIONS

Extended European Search Report dated Jun. 25, 2021, for corresponding European Application No. 21153021.7-1206, 10 pages.

*Primary Examiner* — Lam T Mai
(74) *Attorney, Agent, or Firm* — Seed Intellectual Property Law Group LLP

(57) ABSTRACT

A pulse width modulation (PWM) digital-to-analog conversion circuit includes switches 102, 104, 114, 116 controlled by a first PWM signal, and switches 106, 108, 110, 112 controlled by a second PWM signal. A first operational amplifier (op-amp) includes a first input coupled to an output of a filter, and a second input coupled to an output of the first op-amp. During a first time period, an output of a second op-amp is coupled to an input of the filter via switches 102 and 104, and an output of a third op-amp is coupled to the output of the first op-amp via switches 114 and 116. During a second time period, the output of the second op-amp is coupled to the output of the first op-amp via switches 106 and 108, and an output of the third op-amp is coupled to the input of the filter via switches 110 and 112.

20 Claims, 5 Drawing Sheets

(56) References Cited

U.S. PATENT DOCUMENTS

2021/0271281 A1\* 9/2021 Baorda ............... H03F 3/45475
2021/0297077 A1\* 9/2021 Bogner ............... H03K 17/687

\* cited by examiner

PWM DAC WITH IMPROVED LINEARITY AND INSENSITIVITY TO SWITCH RESISTANCE

BACKGROUND

Technical Field

The present application is directed to digital-to-analog converter circuits, and more particularly to digital-to-analog converter circuits that output analog values based on pulse-width-modulated signals that are input to the digital-to-analog converter circuits.

Description of the Related Art

Calibration devices can generate extremely precise voltage levels that are used to calibrate other devices. For example, a calibration device may be used to calibrate a voltage meter that measures an input voltage level and outputs a measured voltage value corresponding to the input voltage level. More particularly, the calibration device generates and outputs a signal having a predetermined voltage level, which is input to the voltage meter. If the voltage meter outputs a measured voltage value that differs from the predetermined voltage level, the voltage meter may be adjusted so that the measured voltage value equals the predetermined voltage level.

In order to generate a precise voltage level that is output from a calibration device, the calibration device may include circuitry that generates a signal based on Pulse Width Modulation (PWM), which is input to a PWM Digital-to-Analog Converter (DAC). The output of the PWM DAC may be input to an amplifier, for example, prior to being output from the calibration device. Accordingly, it is desirable that the PWM DAC is capable of outputting of a relatively large range of voltage levels. Additionally, it is desirable that the PWM DAC is capable of outputting of a voltage level that is linearly related to the duty cycle of a PWM input signal that is input to the PWM DAC.

BRIEF SUMMARY

The present application discloses a PWM DAC circuit that is capable of outputting of a range of voltage levels that is larger than the range of voltage levels output from a conventional PWM DAC circuit. Additionally, the PWM DAC circuit according to the present disclosure has improved linearity compared to a conventional PWM DAC circuit.

A pulse width modulation (PWM) digital-to-analog conversion (DAC) circuit may be summarized as including a first operational amplifier including a first input terminal, a second input terminal, and an output terminal, wherein a voltage level at the output terminal is based on a voltage level at the second input terminal; and wherein the first input terminal is electrically coupled to a first reference voltage; a second operational amplifier including a first input terminal, a second input terminal, and an output terminal, wherein a voltage level at the output terminal is based on a voltage level at the second input terminal, and wherein the first input terminal is electrically coupled to a second reference voltage; a third operational amplifier including a first input terminal, a second input terminal, and an output terminal, wherein a voltage level at the output terminal is based on a voltage level at the first input terminal and a voltage level at the second input terminal, wherein the output terminal is electrically coupled to the second input terminal; a first switching network which, in operation, electrically couples the output terminal of the first operational amplifier to the first input terminal of the third operational amplifier when the first switching network is in a conducting state, and decouples the output terminal of the first operational amplifier from the first input terminal of the third operational amplifier when the first switching network is in a non-conducting state, wherein a first input signal is provided to the first switching network and the first switching network switches between the conducting state and the non-conducting state based on the first input signal; a second switching network which, in operation, electrically couples the output terminal of the first operational amplifier to the output terminal of the third operational amplifier when the second switching network is in a conducting state, and decouples the output terminal of the first operational amplifier from the output terminal of the third operational amplifier when the second switching network is in a non-conducting state, wherein a second input signal is provided to the second switching network and the second switching network switches between the conducting state and the non-conducting state based on the second input signal; a third switching network which, in operation, electrically couples the output terminal of the second operational amplifier to the first input terminal of the third operational amplifier when the third switching network is in a conducting state, and decouples the output terminal of the second operational amplifier from the first input terminal of the third operational amplifier when the third switching network is in a non-conducting state, wherein the second input signal is provided to the third switching network and the third switching network switches between the conducting state and the non-conducting state based on the second input signal; and a fourth switching network which, in operation, electrically couples the output terminal of the second operational amplifier to the output terminal of the third operational amplifier when the fourth switching network is in a conducting state, and decouples the output terminal of the second operational amplifier from the output terminal of the third operational amplifier when the fourth switching network is in a non-conducting state, wherein the first input signal is provided to the fourth switching network and the fourth switching network switches between the conducting state and the non-conducting state based on the first input signal.

The PWM DAC circuit may further include filter circuitry electrically coupled to the first input terminal of the third operational amplifier, the first switching network, in operation, may electrically couple the output terminal of the first operational amplifier to an input of the filter circuitry when the first switching network is in the conducting state, and decouple the output terminal of the first operational amplifier from the input of the filter circuitry when the first switching network is in the non-conducting state, and the third switching network, in operation, may electrically couple the output terminal of the second operational amplifier to the input of the filter circuitry when the third switching network is in the conducting state, and decouple the output terminal of the second operational amplifier from the input of the filter circuitry when the third switching network is in the non-conducting state. The filter circuitry may include: a first resistor including a first terminal electrically coupled to the input of the filter circuitry, and a second terminal electrically coupled to the first input terminal of the third operational amplifier; and a capacitor including a first terminal electrically coupled to the second terminal of the resistor and to the first input terminal of the third operational amplifier, and a second terminal electrically coupled to a ground terminal.

The first switching network and the fourth switching network may be in the conducting state while the second switching network and the third switching network are in the non-conducting state, and the first switching network and the fourth switching network may be in the non-conducting state while the second switching network and the third switching network are in the conducting state.

The first input signal and the second input signal may be pulse wave modulated signals, the first input signal may have a first voltage level during a first time period, and have a second voltage level during a second time period, the first voltage level may be greater than the second voltage level, the first time period may be different from the second time period, and the second input signal may have the first voltage level during the second time period, and have the second voltage level during the first time period.

A pulse width modulation (PWM) digital-to-analog conversion (DAC) circuit may be summarized as including: filter circuitry; a first operational amplifier including a first input terminal, a second input terminal, and an output terminal, wherein a voltage level at the output terminal is based on a voltage level at the first input terminal and a voltage level at the second input terminal, and wherein the first input terminal is electrically coupled to an output of the filter circuitry, and the output terminal is electrically coupled to the second input terminal; a first switch including a control terminal, a first terminal, and a second terminal, wherein the first switch electrically controls whether the first terminal is electrically coupled to the second terminal based on a voltage level at the control terminal, and wherein the control terminal is electrically coupled to a first input signal, and the second terminal is electrically coupled to an input of the filter circuitry; a second switch including a control terminal, a first terminal, and a second terminal, wherein the second switch electrically controls whether the first terminal is electrically coupled to the second terminal based on a voltage level at the control terminal, and wherein the control terminal is electrically coupled to the first input signal, and the second terminal is electrically coupled to the input of the filter circuitry; a second operational amplifier including a first input terminal, a second input terminal, and an output terminal, wherein a voltage level at the output terminal is based on a voltage level at the second input terminal, and wherein the output terminal is electrically coupled to the first terminal of the first switch, and the first input terminal is electrically coupled to a first reference voltage; a third switch including a control terminal, a first terminal, and a second terminal, wherein the third switch electrically controls whether the first terminal is electrically coupled to the second terminal based on a voltage level at the control terminal, and wherein the control terminal is electrically coupled to a second input signal, the first terminal is electrically coupled to the output terminal of the second operational amplifier, and the second terminal is electrically coupled to the first terminal of the second switch and to the second input terminal of the second operational amplifier; a fourth switch including a control terminal, a first terminal, and a second terminal, wherein the fourth switch electrically controls whether the first terminal is electrically coupled to the second terminal based on a voltage level at the control terminal, and wherein the control terminal is electrically coupled to the second input signal, the first terminal is electrically coupled to the second terminal of the third switch, and the second terminal is electrically coupled to the output terminal of the first operational amplifier; a fifth switch including a control terminal, a first terminal, and a second terminal, wherein the fifth switch electrically controls whether the first terminal is electrically coupled to the second terminal based on a voltage level at the control terminal, and wherein the control terminal is electrically coupled to the second input signal, and the second terminal is electrically coupled to the input of the filter circuitry; a sixth switch including a control terminal, a first terminal, and a second terminal, wherein the sixth switch electrically controls whether the first terminal is electrically coupled to the second terminal based on a voltage level at the control terminal, and wherein the control terminal is electrically coupled to the second input signal, and the second terminal is electrically coupled to the input of the filter circuitry; a third operational amplifier including a first input terminal, a second input terminal, and an output terminal, wherein a voltage level at the output terminal is based on a voltage level at the second input terminal, and wherein the output terminal is electrically coupled to the first terminal of the fifth switch, and the first input terminal is electrically coupled to a second reference voltage; a seventh switch including a control terminal, a first terminal, and a second terminal, wherein the seventh switch electrically controls whether the first terminal is electrically coupled to the second terminal based on a voltage level at the control terminal, and wherein the control terminal is electrically coupled to the first input signal, the first terminal is electrically coupled to the output terminal of the third operational amplifier, and the second terminal is electrically coupled to the first terminal of the sixth switch and to the second input terminal of the third operational amplifier; and an eighth switch including a control terminal, a first terminal, and a second terminal, wherein the eighth switch electrically controls whether the first terminal is electrically coupled to the second terminal based on a voltage level at the control terminal, and wherein the control terminal is electrically coupled to the first input signal, the first terminal is electrically coupled to the second terminal of the seventh switch, and the second terminal is electrically coupled to the output terminal of the first operational amplifier.

The first input terminal of the first operational amplifier may be a non-inverting input terminal, the second input terminal of the first operational amplifier may be an inverting input terminal, the first input terminal of the second operational amplifier may be a non-inverting input terminal, the second input terminal of the second operational amplifier may be an inverting input terminal, the first input terminal of the third operational amplifier may a non-inverting input terminal, and the second input terminal of the third operational amplifier is an inverting input terminal.

The filter circuitry may include: a first resistor including a first terminal electrically coupled to the input of the filter circuitry, and a second terminal electrically coupled to the output of the filter circuitry; and a capacitor including a first terminal electrically coupled to the second terminal of the resistor and to the output of the filter circuitry, and a second terminal electrically coupled to a ground terminal.

The PWM DAC circuit may further include: a second resistor including a first terminal electrically coupled to the second terminal of the fourth switch, and a second terminal electrically coupled to the output terminal of the first operational amplifier; and a third resistor including a first terminal electrically coupled to the second terminal of the eighth switch, and a second terminal electrically coupled to the output terminal of the first operational amplifier, wherein a resistance of the first resistor is equal to a resistance of the second resistor and is equal to a resistance of the third resistor.

The DAC circuit may further include: a first resistor including a first terminal electrically coupled to the output terminal of the second operational amplifier, and a second terminal electrically coupled to the first terminal of the first switch and to the first terminal of the third switch; a first capacitor including a first terminal electrically coupled to the output terminal of the second operational amplifier, and a second terminal electrically coupled to the first terminal of the first switch and to the first terminal of the third switch; a second resistor including a first terminal electrically coupled to the output terminal of the third operational amplifier, and a second terminal electrically coupled to the first terminal of the fifth switch and to the first terminal of the seventh switch; a second capacitor including a first terminal electrically coupled to the output terminal of the third operational amplifier, and a second terminal electrically coupled to the first terminal of the fifth switch and to the first terminal of the seventh switch.

The first input signal and the second input signal may be pulse wave modulated signals.

The first input signal may have a first voltage level during a first time period, and have a second voltage level during a second time period, the first voltage level may be greater than the second voltage level, the first time period may be different from the second time period, and the second input signal may have the first voltage level during the second time period, and have the second voltage level during the first time period.

The first reference voltage and the second reference voltage may have a same magnitude and opposite polarities.

A method may be summarized as including: controlling a first switch based on a first input signal; controlling a second switch based on the first input signal; controlling a third switch based on a second input signal; controlling a fourth switch based on the second input signal; controlling a fifth switch based on the second input signal; controlling a sixth switch based on the second input signal; controlling a seventh switch based on the first input signal; controlling an eighth switch based on the first input signal; electrically coupling a first reference voltage to a first input of a first operational amplifier; electrically coupling a second reference voltage to a first input of a second operational amplifier; electrically coupling an output of filter circuitry to a first input of a third operational amplifier; electrically coupling an output of the third operational amplifier to a second input of the third amplifier; electrically coupling an output of the first operational amplifier to an input of the filter circuitry via the first switch when the first switch is in a conducting state; electrically coupling the output of the first operational amplifier to a second input of the first operational amplifier via the first switch and the second switch when the first switch and the second switch are in a conducting state; electrically coupling an output of the second operational amplifier to a second input of the second operational amplifier via the seventh switch when the seventh switch is in a conducting state; electrically coupling the output of the second operational amplifier to the output of the third operational amplifier via the seventh switch and the eighth switch when the seventh switch and the eighth switch are in a conducting state; electrically coupling the output of the first operational amplifier to the second input of the first operational amplifier via the third switch when the third switch is in a conducting state; electrically coupling the output of the first operational amplifier to the output of the third operational amplifier via the third switch and the fourth switch when the third switch and the fourth are in a conducting state; electrically coupling the output of the second operational amplifier to the input of the filter circuitry via the fifth switch when the fifth switch is in a conducting state; and electrically coupling the output of the second operational amplifier to the second input of the second operational amplifier via the fifth switch and the sixth switch when the fifth switch and the sixth switch are in a conducting state.

The electrically coupling the output of the first operational amplifier to the input of the filter circuitry via the first switch may be performed during a first time period, the electrically coupling the output of the first operational amplifier to the second input of the first operational amplifier via the first switch and the second switch may be performed during the first time period, the electrically coupling the output of the second operational amplifier to the second input of the second operational amplifier via the seventh switch may be performed during the first time period, the electrically coupling the output of the second operational amplifier to the output of the third operational amplifier via the seventh switch and the eighth switch may be performed during the first time period, the electrically coupling the output of the first operational amplifier to the second input of the first operational amplifier via the third switch may be performed during a second time period, the second time period being different from the first time period; the electrically coupling the output of the first operational amplifier to the output of the third operational amplifier via the third switch and the fourth switch may be performed during the second time period; the electrically coupling the output of the second operational amplifier to the second input of the second operational amplifier via the fifth switch and the sixth switch may be performed during the second time period, and the electrically coupling the output of the second operational amplifier to the input of the filter circuitry via the seventh switch may be performed during the second time period.

The first input signal and the second input signal may be pulse width modulated signals.

The first input signal may have a first voltage level during the first time period, and has a second voltage level during the second time period, the first voltage level may be greater than the second voltage level, and the second input signal may have the first voltage level during the second time period, and have the second voltage level during the first time period.

The filter circuitry may include a first resistor and a capacitor, the electrically coupling the output of the first operational amplifier to the output of the third operational amplifier via the third switch and the fourth switch may include electrically coupling the output of the first operational amplifier to the output of the third operational amplifier via the third switch, the fourth switch, and a second resistor, the electrically coupling the output of the second operational amplifier to the output of the third operational amplifier via the seventh switch and the eighth switch may include electrically coupling the output of the second operational amplifier to the output of the third operational amplifier via the seventh switch, the eighth switch, and a third resistor, and a resistance of the first resistor may be equal to a resistance of the second resistor and may be equal to a resistance of the third resistor.

The electrically coupling the output of the first operational amplifier to the input of the filter circuitry via the first switch may include: electrically coupling the output of the first operational amplifier to a first terminal of a first resistor;

electrically coupling the output of the first operational amplifier to a first terminal of a first capacitor; electrically coupling a second terminal of the first resistor to the first switch; electrically coupling a second terminal of the first capacitor to the first switch, and the electrically coupling the output of the second operational amplifier to the input of the filter circuitry via the fifth switch may include: electrically coupling the output of the second operational amplifier to a first terminal of a second resistor; electrically coupling the output of the second operational amplifier to a first terminal of a second capacitor; electrically coupling a second terminal of the second resistor to the fifth switch; and electrically coupling a second terminal of the second capacitor to the fifth switch.

The positive reference voltage and the negative reference voltage may have a same magnitude and opposite polarities.

DETAILED DESCRIPTION

Figure 1:
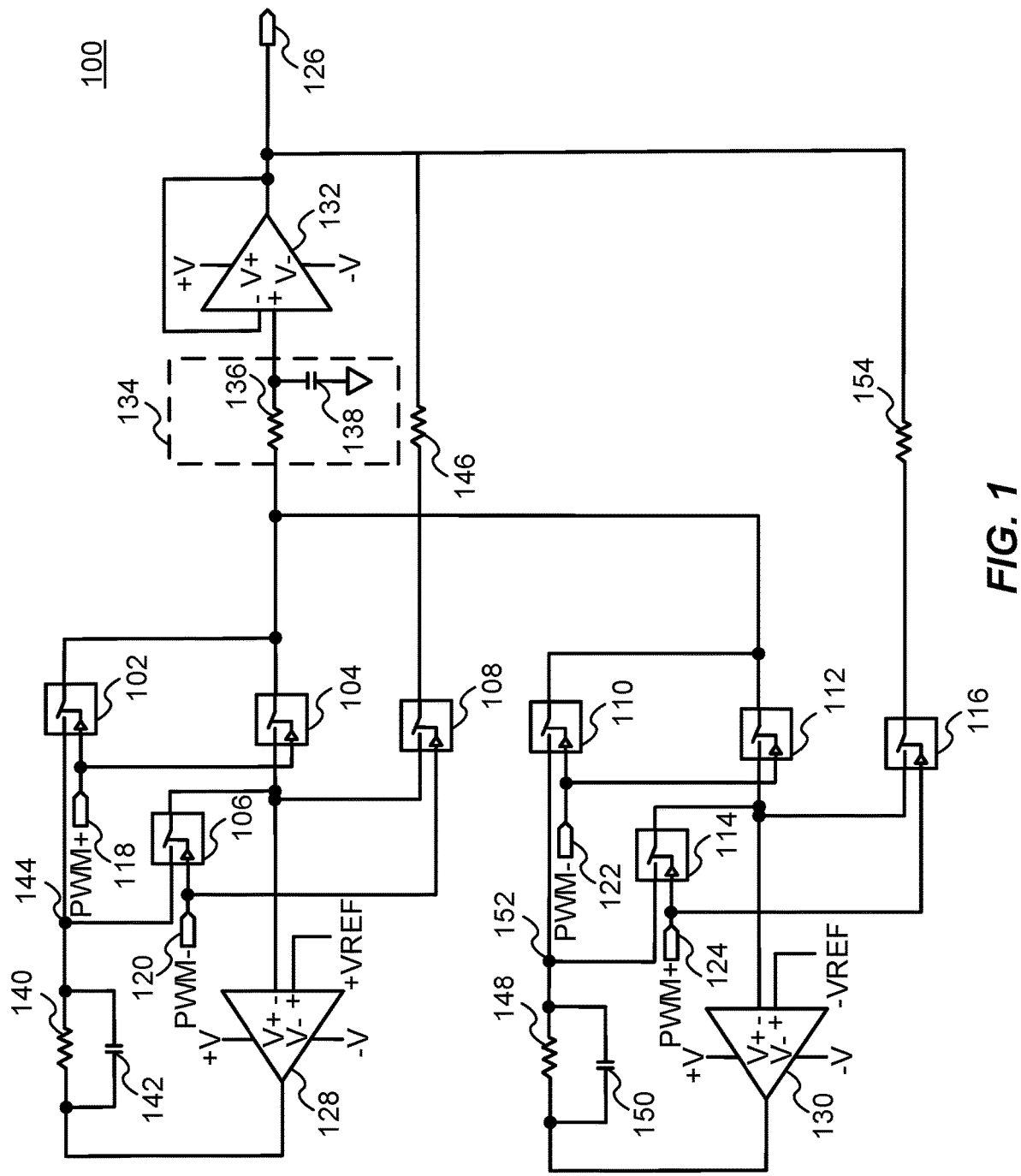
FIG. 1 is a diagram of a PWM DAC circuit, according to one or more embodiments of the present disclosure.

FIG. 1 is a diagram of a Pulse Width Modulation (PWM) Digital-to-Converter (DAC) circuit 100, according to one or more embodiments of the present disclosure. The PWM DAC circuit 100 includes eight analog switches 102, 104, 106, 108, 110, 112, 114, and 116. Each of the analog switches 102-116 includes a first terminal, a second terminal, and a control terminal. Each of the analog switches 102-116 electrically controls whether the first terminal is electrically coupled to the second terminal based on a voltage level at the control terminal.

In one or more embodiments, each of the analog switches 102-116 is normally "off". While the voltage level of a signal supplied to the control terminal of a switch is less than or equal to a predetermined value (e.g., zero volts), the switch is closed or turned "on" (i.e., a conducting state), and the first terminal of the switch is electrically coupled to the second terminal of the switch. While the voltage level of the signal supplied to the control terminal of the switch is above the predetermined value, the switch is open or turned "off" (i.e., a non-conducting state), and the first terminal of the switch is electrically decoupled from the second terminal of the switch. In one or more embodiments, each of the analog switches 102-116 includes two field effect transistors (FETs) that provide the switch functionality.

The PWM DAC circuit 100 includes four input terminals 118, 120, 122, and 124, in addition to an output terminal 126. A first PWM input signal PWM+ is input to the PWM DAC circuit 100 via the input terminals 118 and 124. For example, an output terminal of circuitry that generates the first PWM input signal PWM+ (not shown) is electrically coupled to wires that are respectively electrically coupled to the input terminals 118 and 124 of the PWM DAC circuit 100. A second PWM input signal PWM− is input to the PWM DAC circuit 100 via the input terminals 120 and 122. For example, an output terminal of circuitry that generates the second PWM input signal PWM− (not shown) is electrically coupled to wires that are respectively electrically coupled to the input terminals 120 and 122 of the PWM DAC circuit 100.

The first PWM input signal PWM+ and the second PWM input signal PWM− have the same peak-to-peak voltage level. In one or more embodiments, the second PWM input signal PWM− is 180 degrees out of phase with the first PWM input signal PWM+, The first PWM input signal PWM+ and the second PWM input signal PWM− are described in greater detail below with reference to FIGS. 2A and 2B.

The PWM DAC circuit 100 also includes an operational amplifier 128, an operational amplifier 130, and an operational amplifier 132. The operational amplifier 128 and the operational amplifier 130 are configured to deliver a precise voltage at either the output of the switch 104 or the switch 108 and the switch 116. Accordingly, the inverting and non-inverting terminals should never differ and the output terminal does not approach +V. Each of the operational amplifier 128 and the operational amplifier 130 includes a non-inverting input terminal that is electrically coupled to a reference potential, an inverting input terminal, and an output terminal, wherein a voltage level at the output terminal is based on a voltage level at the non-inverting input terminal.

The operational amplifier 132 includes a non-inverting input terminal, an inverting input terminal, and an output terminal, wherein a voltage level at the output terminal is based on a voltage level at the non-inverting input terminal and a voltage level at the inverting input terminal. The operational amplifier 132 is configured to operate in its linear region as a unity gain buffer.

In one or more embodiments, each of the operational amplifier 128, the operational amplifier 130, and the operational amplifier 132 is a chopper-stabilized operational amplifier with very low offset.

The operational amplifier 128 and the operational amplifier 130 are electrically coupled to filter circuitry 134 via the switches 102-116. In the depicted embodiment, the filter circuitry 134 includes a resistor 136 and a capacitor 138. A first terminal of the resistor 136 is electrically coupled to an input of the filter circuitry 134. A second terminal of the resistor 136 is electrically coupled to a first terminal of the capacitor 138. A second terminal of the capacitor 138 is electrically coupled to a ground terminal. The second terminal of the resistor 136 and the first terminal of the capacitor 138 are electrically coupled to an output of the filter circuitry 134, which is electrically coupled to the non-inverting input terminal of the operational amplifier 132. The output terminal of the operational amplifier 132 is electrically coupled to the inverting input terminal of the operational amplifier 132 and to the output terminal 126 of the PWM DAC circuit 100.

In one or more embodiments, the output terminal of the operational amplifier 128 is electrically coupled to a first terminal of a resistor 140 and to a first terminal of a capacitor 142. The resistor 140 and the capacitor 142 are electrically coupled in parallel. More particularly, a second terminal of the resistor 140 is electrically coupled to the second terminal of the capacitor 142 and to a node 144, which is electrically coupled to the first terminal of the switch 102 and to the first terminal of the switch 106. The inverting input terminal of the operational amplifier 128 is electrically coupled to the first terminal of the switch 104, the second terminal of the switch 106, and the first terminal of the switch 108. The non-inverting input terminal of the operational amplifier 128 is electrically coupled to a positive reference voltage +VREF. The resistor 140 and the capacitor 142 may be added for stability, wherein the resistance of the resistor 140 and the capacitance of the capacitor 142 are selected based on characteristics of the operational amplifier 128.

The control terminal of the switch 102 and the control terminal of the switch 104 are electrically coupled to the input terminal 118, to which the first PWM input signal PWM+ is provided. While the first PWM input signal PWM+ has a voltage level that is less than or equal to a predetermined value (e.g., zero volts), the switch 102 and the switch 104 are closed or turned "on", thus causing the first terminal of the switch 102 to be electrically coupled to the second terminal of the switch 102, and the first terminal of the switch 104 to be electrically coupled to the second terminal of the switch 104. While the first PWM input signal PWM+ has a voltage level that is above the predetermined value, the switch 102 and the switch 104 are open or turned "off", thus causing the first terminal of the switch 102 to be electrically decoupled from the second terminal of the switch 102 and the first terminal of the switch 104 to be electrically decoupled from the second terminal of the switch 104.

The second terminal of the switch 102 and the second terminal of the switch 104 are electrically coupled to the first terminal of the resistor 136 of the filter circuitry 134. As mentioned above, the node 144 is electrically coupled to the first terminal of the switch 102 and to the first terminal of the switch 106. The second terminal of the switch 106 is electrically coupled to the first terminal of the switch 104, to the first terminal of the switch 108, and to the inverting input terminal of the operational amplifier 128, The second terminal of the switch 108 is electrically coupled to a first terminal of a resistor 146. A second terminal of the resistor 146 is electrically coupled to the output terminal of the operational amplifier 132, to the inverting input terminal of the operational amplifier 132, and to the output terminal 126 of the PWM DAC circuit 100.

The control terminal of the switch 106 and the control terminal of the switch 108 are electrically coupled to the input node 120, to which the second PWM input signal PWM− is provided. While the second PWM input signal PWM− has a voltage level that is less than or equal to a predetermined value (e.g., zero volts), the switch 106 and the switch 108 are closed or turned "on", thus causing the first terminal of the switch 106 to be electrically coupled to the second terminal of the switch 106, and the first terminal of the switch 108 to be electrically coupled to the second terminal of the switch 108. While the second PWM input signal PWM− has a voltage level that is above the predetermined value, the switch 106 and the switch 108 are open or turned "off", thus causing the first terminal of the switch 106 to be electrically decoupled from the second terminal of the switch 106, and the first terminal of the switch 108 to be electrically decoupled from the second terminal of the switch 108.

In one or more embodiments, the output terminal of the operational amplifier 130 is electrically coupled to a first terminal of a resistor 148 and to a first terminal of a capacitor 150. The resistor 148 and the capacitor 150 are electrically coupled in parallel. More particularly, a second terminal of the resistor 148 is electrically coupled to the second terminal of the capacitor 150 and to a node 152, which is electrically coupled to the first terminal of the switch 110 and to the first terminal of the switch 114, The inverting input terminal of the operational amplifier 130 is electrically coupled to the first terminal of the switch 112, to the second terminal of the switch 114, and to the first terminal of the switch 116. The non-input terminal of the operational amplifier 130 is electrically coupled to a negative reference voltage −VREF. In one or more embodiments, the magnitude of the positive reference voltage +VREF and the negative reference voltage −VREF have the same magnitude but opposite polarities. The resistor 148 and the capacitor 150 may be added for stability, wherein the resistance of the resistor 148 and the capacitance of the capacitor 150 are selected based on characteristics of the operational amplifier 130.

The control terminal of the switch 110 and the control terminal of the switch 112 are electrically coupled to the input node 122, to which the second PWM input signal PWM− is provided. While the second PWM input signal PWM− has a voltage level that is less than or equal to a predetermined value (e.g., zero volts), the switch 110 and the switch 112 are closed or turned "on", thus causing the first terminal of the switch 110 to be electrically coupled to the second terminal of the switch 110, and the first terminal of the switch 112 to be electrically coupled to the second terminal of the switch 112. While the second PWM input signal PWM− has a voltage level that is above the predetermined value, the switch 110 and the switch 112 are open or turned "off", thus causing the first terminal of the switch 110 to be electrically decoupled from the second terminal of the switch 110, and the first terminal of the switch 112 to be electrically decoupled from the second terminal of the switch 112. The second terminal of the switch 110 and the second terminal of the switch 112 are electrically coupled to the first terminal of the resistor 136 that is electrically coupled to the input to the filter circuitry 134.

As mentioned above, the node 152 is electrically coupled to the first terminal of the switch 110 and to the first terminal of the switch 114. The second terminal of the switch 114 is electrically coupled to the first terminal of the switch 112, to the first terminal of the switch 116, and to the inverting input terminal of the operational amplifier 130. The second terminal of the switch 116 is electrically coupled to a first terminal of a resistor 154. A second terminal of the resistor 154 is electrically coupled to the output terminal of the operational amplifier 132 and to the output terminal of the PWM DAC circuit 100.

The control terminal of the switch 114 and the control terminal of the switch 116 are electrically coupled to the input node 124, to which the first PWM input signal PWM+ is provided. While the first PWM input signal PWM+ has a voltage level that is less than or equal to a predetermined value (e.g., zero volts), the switch 114 and the switch 116 are closed or turned "on", thus causing the first terminal of the switch 114 to be electrically coupled to the second terminal of the switch 114, and the first terminal of the switch 116 to be electrically coupled to the second terminal of the switch 116. The second terminal of the switch 114 is electrically coupled to the first terminal of the switch 112 and to the first terminal of the switch 116. While the first PWM input signal PWM+ has a voltage level that is above the predetermined value, the switch 114 and the switch 116 are open or turned "off", thus causing the first terminal of the switch 114 to be electrically decoupled from the second terminal of the switch 114, and the first terminal of the switch 116 to be electrically decoupled from the second terminal of the switch 116.

In one or more embodiments, the switch 102 and the switch 104 form a first switching network which, in operation, electrically couples the output terminal of the operational amplifier 128 to the input of the filter circuitry 134, which is electrically coupled to the non-inverting input terminal of the third operational amplifier, when the first switching network is in a conducting state, and decouples the output terminal of the operational amplifier 128 from the input of the filter circuitry 134, which is electrically coupled to the non-Inverting input terminal of the third operational amplifier, when the first switching network is in a non-conducting state, wherein the first PWM input signal PWM+ is provided to the first switching network and the first switching network switches between the conducting state and the non-conducting state based on the first PWM input signal PWM+.

In one or more embodiments, the switch 106 and the switch 108 form a second switching network which, in operation, electrically couples the output terminal of the operational amplifier 128 to the output terminal of the third operational amplifier, when the second switching network is in a conducting state, and decouples the output terminal of the operational amplifier 128 from the output terminal of the third operational amplifier, when the second switching network is in a non-conducting state, wherein the second PWM input signal PWM− is provided to the second switching network and the second switching network switches between the conducting state and the non-conducting state based on the second PWM input signal PWM−.

In one or more embodiments, the switch 110 and the switch 112 form a third switching network which, in operation, electrically couples the output terminal of the operational amplifier 130 to the input of the filter circuitry 134, which is electrically coupled to the non-inverting input terminal of the third operational amplifier, when the third switching network is in a conducting state, and decouples the output terminal of the operational amplifier 130 from the input of the filter circuitry 134, which is electrically coupled to the non-inverting input terminal of the third operational amplifier, when the third switching network is in a non-conducting state, wherein the second PWM input signal PWM− is provided to the third switching network and the third switching network switches between the conducting state and the non-conducting state based on the second PWM input signal PWM−.

In one or more embodiments, the switch 114 and the switch 116 form a fourth switching network which, in operation, electrically couples the output terminal of the operational amplifier 130 to the output terminal of the third operational amplifier, when the fourth switching network is in a conducting state, and decouples the output terminal of the operational amplifier 130 from the output terminal of the third operational amplifier, when the fourth switching network is in a non-conducting state, wherein the first PWM input signal PWM+ is provided to the fourth switching network and the fourth switching network switches between the conducting state and the non-conducting state based on the first PWM input signal PWM+.

Figure 2A:
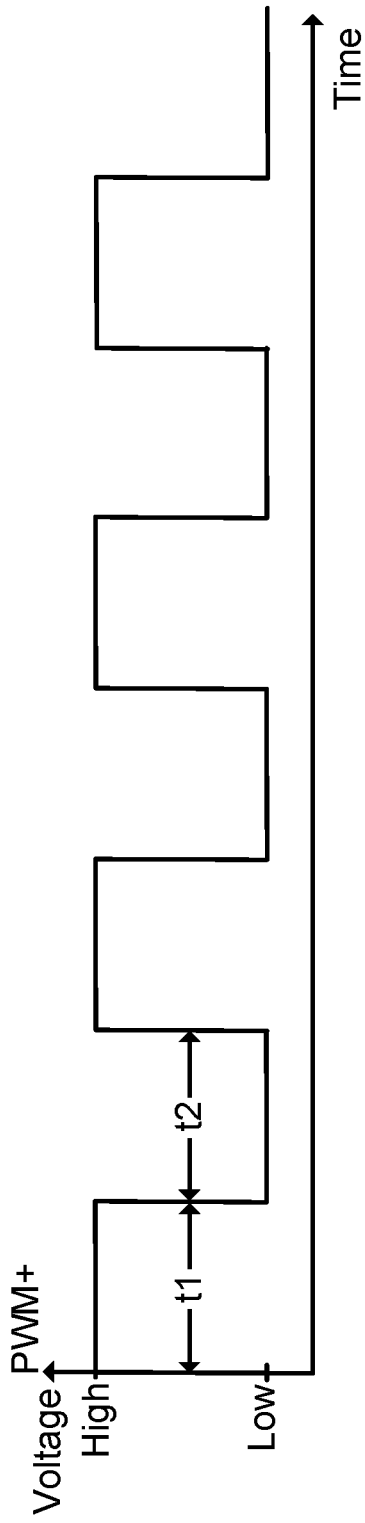
FIGS. 2A and 2B are examples of timing diagrams of PWM input signals that can be input to the PWM DAC circuit shown in FIG. 1, according to one or more embodiments of the present disclosure.
Figure 2B:
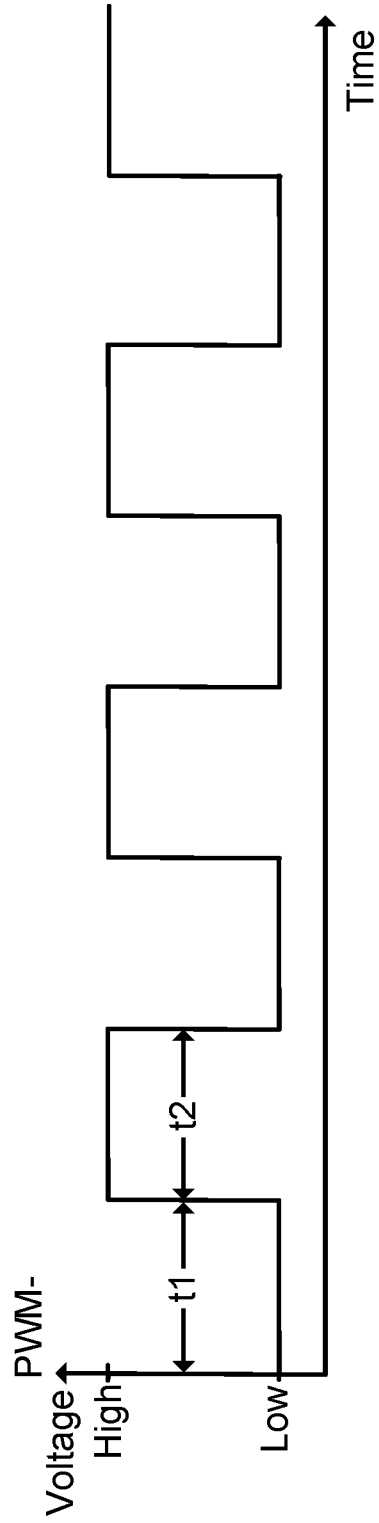

Having described the structure of the PWM DAC circuit 100, operation of the PWM DAC circuit 100 will now be described with reference to FIGS. 1, 2A, and 2B. FIGS. 2A and 2B are examples of timing diagrams of the first PWM input signal PWM+ and the second PWM input signal PWM− that can be input to the PWM DAC circuit 100 shown in FIG. 1, according to one or more embodiments of the present disclosure. More particularly, FIG. 2A is an example of a timing diagram of the first PWM input signal PWM+, and FIG. 2B is an example of a timing diagram of the second PWM input signal PWM−.

The first PWM input signal PWM+ has a high voltage level during a time period t1 and has a low voltage level during a time period t2, as shown in FIG. 2A. The duty cycle of the first PNM input signal PWM+ is equal to t1/(t1+t2). The second PWM input signal PWM− has a low voltage level during the time period t1 and has a high voltage level during the time period t2, as shown in FIG. 2B. Thus, the duty cycle of the second PWM input signal PVM+ is equal to t2/(t1+t2). Each of the first PWM input signal PWM+ and the second PWM input signal PWM− has a constant frequency. In other words, the sum of the time period t1 and the time period t2 is a constant value. The first PWM input signal PWM+ and the second PWM input signal PWM− shown in FIGS. 2A and 2B each have a duty cycle of 50%. During operation of the PWM DAC circuit 100, however, PWM input signals having other duty cycles can be input to the PWM DAC circuit 100 depending on the desired voltage level at the output terminal 126 of the PWM DAC circuit 100.

In one or more embodiments, the PWM DAC circuit 100 is configured to receive the first PWM input signal PWM+ and the second PWM input signal PWM− from external circuitry. In one or more embodiments, the PWM DAC circuit 100 is configured to generate the first PWM input signal PWM+ and the second PWM input signal PWM−. The PWM DAC circuit 100 may include one or more microprocessors or Field Programmable Gate Arrays (FPGAs) that generate the first PWM input signal PWM+ and the second PWM input signal PWM− based on drive signals that are input to the microprocessors or the FPGAs. For example, a drive signal having a value corresponding to a duty cycle of 50% causes a FPGA to output a signal having a high value during a first half of a fixed number of clock cycles, and having a low value during a second half of the fixed number of clock cycles.

As will be described below in greater detail, the switches 102, 104, 114, and 116 are closed or "on" during time periods in which the first PWM input signal PWM+ has a voltage level that is less than or equal to a predetermined value (e.g., zero volts), such as during the time period t1. The switches 102, 104, 114, and 116 are open or "off" during time periods in which the first PWM input signal PWM+ has a voltage level that is above the predetermined value, such as during the time period t2. Additionally, the switches 106, 108, 110, and 112 are closed or during time periods in which the second PWM input signal PWM− has a voltage level that is less than or equal to the predetermined value, such as during the time period t2. The switches 106, 108, 110, and 112 are open or "off" during time periods in which the second PWM input signal PWM− has a voltage level that is above the predetermined value, such as during the time period t1.

Operation of the upper half of the PWM DAC circuit 100 will now be described. The output terminal of the operational amplifier 128 provides a charging current to the input of the filter circuitry 134 when +VREF is switched in. While the switch 102 and the switch 104 are on, the switch 106 and the switch 108 are off, and the output terminal of the operational amplifier 128 provides the charging current to the input of the filter circuitry 134. While the switch 104 is on, only an input bias current and a leakage current from the switch 106 and the switch 108, which are relatively small currents, flow through the switch 104. Therefore, those small currents times the resistance of the switch 104 result in a voltage that is negligible and accounts for nearly undetectable errors in the output of the switch 104. Because the switch 102 is in the loop, the resistance of the switch 102 does not affect the output of the PWM DAC circuit 100. A voltage level very close to +VREF is seen at the input of the filter circuitry 134.

While the switch 102 and the switch 104 are off, and the switch 106 and the switch 108 are on, the output terminal of the operational amplifier 128 provides the charging current through the resistor 146 to the output terminal of the operational amplifier 132. Because the resistance of the resistor 136 is equal to the resistance of the resistor 146, and because the voltage level at the output of the filter circuitry 134 and the voltage level at the output of the operational amplifier 132 are identical, the operational amplifier 128 does not see a load change except for a small switching transient as the switch 102 and the switch 104 turn off, and as the switch 106 and the switch 108 turn on. This keeps the output of the operational amplifier 128 stable and constant during PWM, which minimizes clewing errors.

Operation of the lower half of the PWM DAC circuit 100 will now be described. The operational amplifier 130 provides a charging current to the input of the filter circuitry 134 when −VREF is switched in. While the switch 110 and the switch 112 are on, the switch 114 and the switch 116 are off, and the operational amplifier 130 provides the charging current to the input of the filter circuitry 134. While the switch 112 is on, only an input bias current and a leakage current from the switch 114 and the switch 116, which are relatively small currents, flow through the switch 112. Therefore, those small currents times the resistance of the switch 112 result in a voltage that is negligible and accounts for nearly undetectable errors in the output of the switch 112. Because the switch 110 is in the loop, the resistance of the switch 110 does not affect the output of the PWM DAC circuit 100. A voltage level very close to −VREF is seen at the input of the filter circuitry 134.

Mile the switch 110 and the switch 112 are off, and the switch 114 and the switch 116 are on, the operational amplifier 130 provides the charging current through the resistor 154 to the output terminal of the operational amplifier 132. Because the resistance of the resistor 136 is equal to the resistance of the resistor 154, and because the voltage level at the output of the filter circuitry 134 and the voltage level at the output of the operational amplifier 132 are identical, the operational amplifier 130 does not see a load change except for a small switching transient as the switch 110 and the switch 112 turn off, and as the switch 114 and the switch 116 turn on. This keeps the output voltage level of the operational amplifier 130 stable and constant during PWM, which minimizes clewing errors.

A benefit of the PWM DAC circuit 100 is that virtually no current is drawn from +VREF or −VREF, thus the PWM DAC circuit 100 eliminates reference loading errors and glitching.

The voltage level at the output terminal 126 of the PWM DAC circuit 100 is given by Equation 1 below.

$$VDAC=((+VREF-(-VREF))\times D)+(-VREF) \quad \text{(Equation 1)}$$

In Equation 1, D is the duty cycle of t1/(t1+t2), wherein t1 is the time period during which the switch 102, the switch 104, the switch 114, and the switch 116 are on, and t2 is the time period during which the switch 106, the switch 108, the switch 110, and the switch 112 are on.

The placement of the switches 102-116 within the PWM DAC circuit 100 is a key aspect of the PWM DAC circuit 100. The switch 102 connects the output of the operational amplifier 128, through the resistor 140, to the input of the filter circuitry 134 while the switch 104 simultaneously connects the input of the filter circuitry 134 to the inverting input terminal of the operational amplifier 128 while +VREF is being applied to the filter circuitry 134. Then, the switch 106 and the switch 108 simultaneously turn on when the switch 102 and the switch 104 turn off to apply the output of the operational amplifier 128 to the resistor 146 to keep the operational amplifier 128 in a normal output state.

Similarly, the switch 110 connects the output terminal of the operational amplifier 130, through the resistor 148, to the input of the filter circuitry 134, while the switch 112 connects the inverting input terminal of the operational amplifier 130 to the input of the filter circuitry 134 during the time −VREF is applied to the filter circuitry 134. The PWM DAC circuit 100 uses the operational amplifier 130 to "sense" the input of the filter circuitry 134 to remove errors from IR (i.e., current times resistance) drops in switch resistance. Then, the switch 114 and the switch 116 connect the output of the operational amplifier 130 to the resistor 154 during the time +VREF is applied to the filter circuitry 134. Accordingly, the operational amplifier 128 and the operational amplifier 130 switch from the voltage level at the input of the filter circuitry 134 to the voltage level at the output terminal 126 of the PWM DAC circuit 100 so they see minimal perturbances, thereby reducing stewing errors.

Figure 3A:
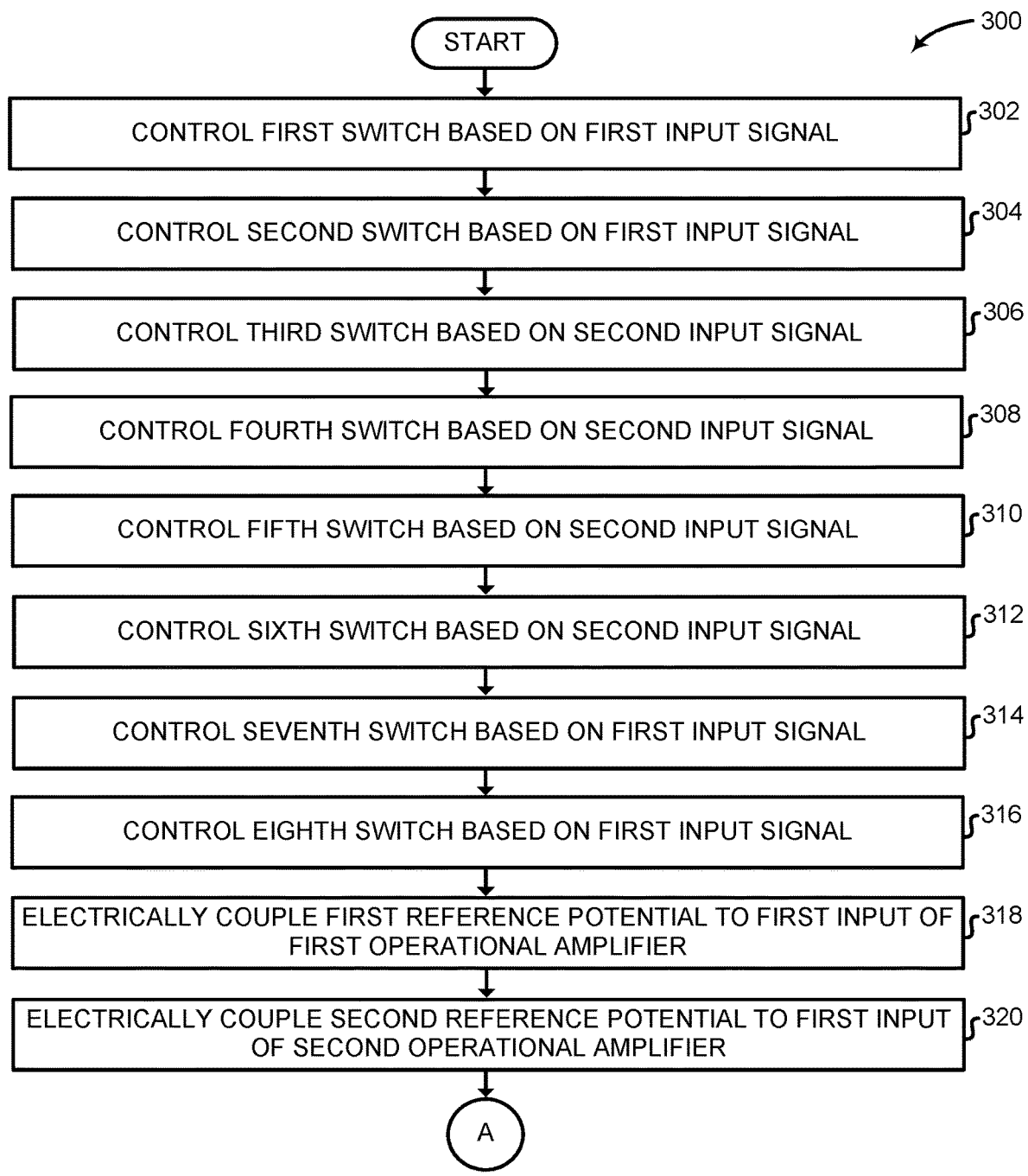
FIGS. 3A and 3B show a flowchart of a method, according to one or more embodiments of the present disclosure.
Figure 3B:
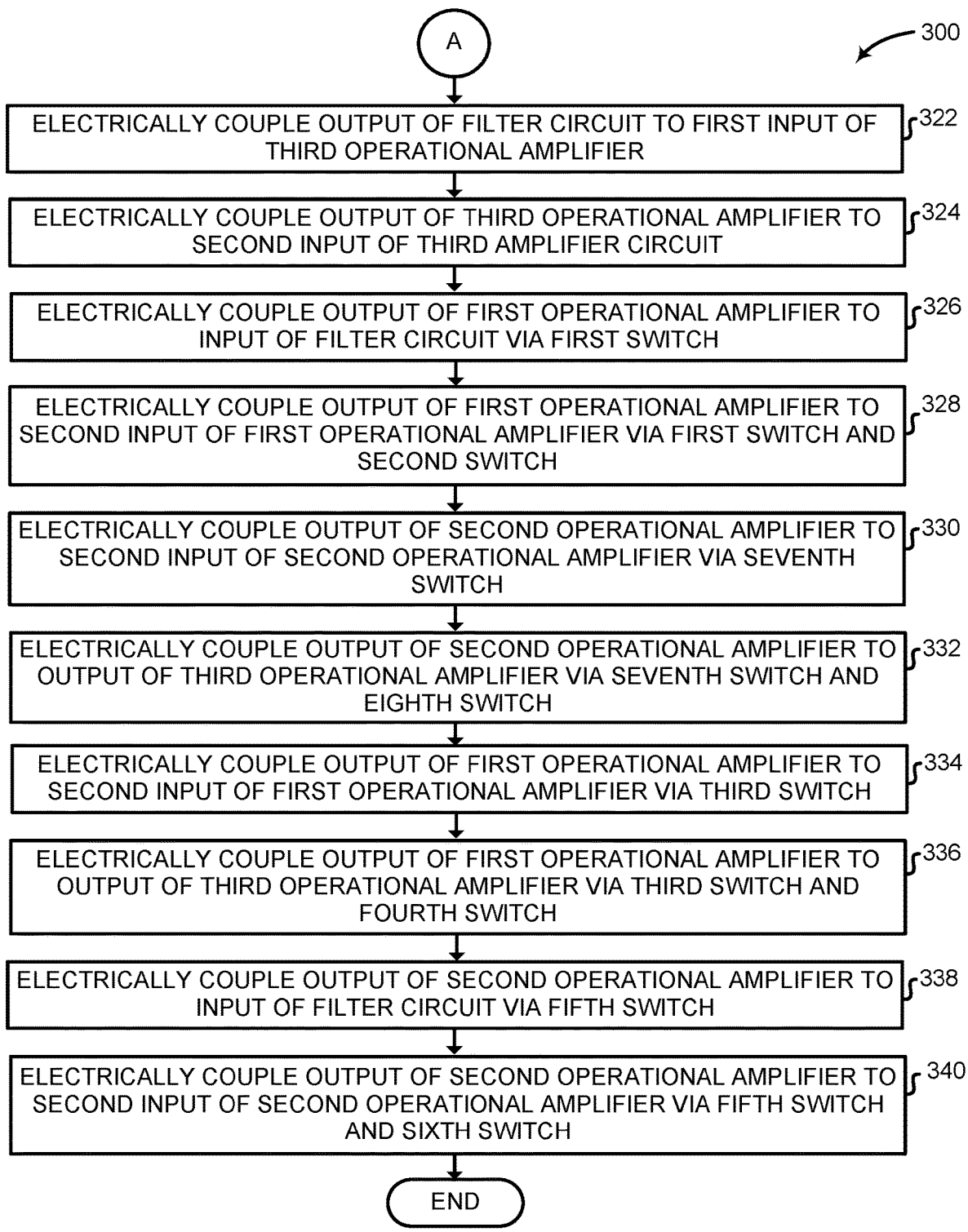

FIGS. 3A and 3B show a flowchart of a method 300, according to one or more embodiments of the present disclosure. The method 300 begins at 302.

At 302, a first switch is controlled based on a first input signal. For example, at 302, the switch 102 is controlled based on the first PWM input signal PWM+, as described above.

At 304, a second switch is controlled based on a first input signal. For example, at 304, the switch 104 is controlled based on the first PWM input signal PWM+, as described above.

At 306, a third switch is controlled based on a second input signal. For example, at 306, the switch 106 is controlled based on the second PWM input signal PWM−, as described above.

At 308, a fourth switch is controlled based on a second input signal. For example, at 308, the switch 108 is controlled based on the second PWM input signal PWM−, as described above.

At 310, a fifth switch is controlled based on the second input signal. For example, at 310, the switch 110 is controlled based on the second PWM input signal PWM−, as described above.

At 312, a sixth switch is controlled based on the second input signal. For example, at 312, the switch 112 is controlled based on the second PWM input signal PWM−, as described above.

At 314, a seventh switch is controlled based on the first input signal. For example, at 314, the switch 114 is controlled based on the first PWM input signal PWM+, as described above.

At 316, an eighth switch is controlled based on the first input signal. For example, at 316, the switch 116 is controlled based on the first PWM input signal PWM+, as described above. While control of the first switch through eighth switch is described in a sequence of blocks 302 to 316, it should be understood that the eight switches may be controlled simultaneously (i.e., there is not necessarily a sequence in which the eight switches are controlled).

At 318, a first reference voltage is electrically coupled to a first input of a first operational amplifier. For example, at 318, the positive reference voltage+VREF is electrically coupled to the non-inverting input terminal of the operational amplifier 128, as described above.

At 320, a second reference voltage is electrically coupled to a first input of a second operational amplifier. For example, at 320, the negative reference voltage −VREF is electrically coupled to the non-inverting input terminal of the operational amplifier 130, as described above.

At 322, an output of filter circuitry is electrically coupled to a first input of a third operational amplifier. For example, at 322, the output of the filter circuitry 134 is electrically coupled to the non-inverting input terminal of the operational amplifier 132, as described above.

At 324, an output of the third operational amplifier is electrically coupled to a second input of the third amplifier circuit. For example, at 324, the output terminal of the operational amplifier 132 is electrically coupled to the inverting input terminal of the amplifier circuit 132, as described above.

At 326, an output of the first operational amplifier is electrically, coupled to an input of the filter circuitry via the first switch. For example, at 326, the output terminal of the operational amplifier 128 is electrically coupled to the input of the filter circuitry 134 via the switch 102 when the switch 102 is in a conducting state, as described below in greater detail with reference to FIG. 4.

At 328, the output of the first operational amplifier is electrically coupled to a second input of the first operational amplifier via the first switch and the second switch. For example, at 328, the output of the operational amplifier 128 is electrically coupled to the inverting input terminal of the operational amplifier 128 via the switch 102 and the switch 104 when the switch 102 and the switch 104 are in a conducting state, as described above.

At 330, an output of the second operational amplifier is electrically coupled to a second input of the second operational amplifier via the seventh switch. For example, at 330, the output terminal of the operational amplifier 130 is electrically coupled to the inverting input terminal of the operational amplifier 130 via the switch 114 when the switch 114 is in a conducting state, as described above.

At 332, the output of the second operational amplifier is electrically coupled to the output of the third operational amplifier via the seventh switch and the eighth switch. For example, at 332, the output of the operational amplifier 130 is electrically coupled to the output terminal of the operational amplifier 132 via the switch 114 and the switch 116 when the switch 114 and the switch 116 are in a conducting state, as described above.

At 334, the output of the first operational amplifier is electrically coupled to the second input of the first operational amplifier via the third switch. For example, at 334, the output terminal of the operational amplifier 128 is electrically coupled to the inverting input terminal of the operational amplifier 128 via the switch 106 when the switch 106 is in a conducting state, as described above.

At 336, the output of the first operational amplifier is electrically coupled to the output of the third operational amplifier via the third switch and the fourth switch. For example, at 336, the output terminal of the operational amplifier 128 is electrically coupled to the output terminal of the operational amplifier 132 via the switch 106 and the switch 108 when the switch 106 and the switch 108 are in a conducting state, as described above.

At 338, the output of the second operational amplifier electrically coupled to the input of the filter circuitry via the fifth switch. For example, at 338, the output terminal of the operational amplifier 130 is electrically coupled to the input of the filter circuitry 134 via the switch 110 when the switch 110 is in a conducting state, as described below in greater detail with reference to FIG. 5.

At 340, the output of the second operational amplifier is electrically coupled to the second input of the second operational amplifier via the fifth switch and the sixth switch. For example, at 340, an output of the operational amplifier 130 is electrically coupled to the inverting input terminal of the operational amplifier 130 via the switch 110 and the switch 112 when the switch 110 and the switch 112 are in a conducting state, as described above, in one or more embodiments, above-described acts are performed at different times depending on the conducting or non-conducting state of the respective switches at any particular time. The above-described acts are not necessarily performed in the sequence illustrated in FIGS. 3A and 3B.

Figure 4:
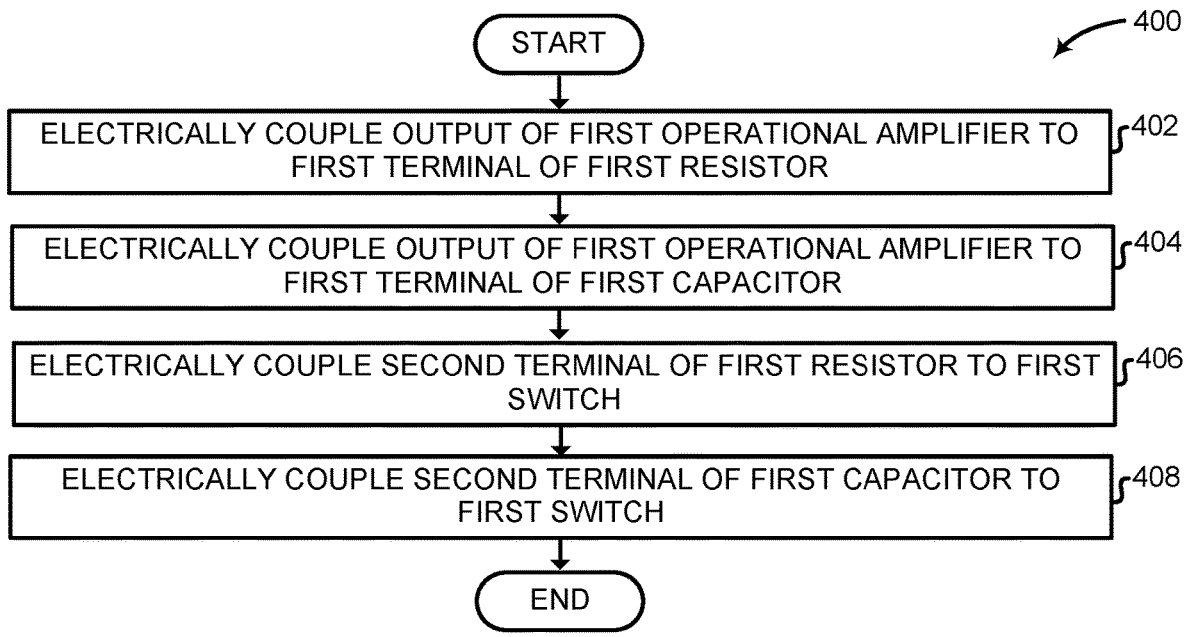
FIG. 4 shows a flowchart of a method, according to one or more embodiments of the present disclosure.

FIG. 4 shows a flowchart of a method 400, according to one or more embodiments of the present disclosure. The method 400 corresponds to block 326 of the method 300 described above. The method 400 begins at 402.

At 402, the output of the first operational amplifier is electrically coupled to a first terminal of a first resistor. For example, at 402, the output terminal of the operational amplifier 128 is electrically coupled to the first terminal of the resistor 140, as described above.

At 404, the output of the first operational amplifier is electrically coupled to a first terminal of a first capacitor. For example, at 404, the output terminal of the operational amplifier 128 is electrically coupled to the first terminal of the capacitor 142, as described above.

At 406, a second terminal of the first resistor is electrically coupled to the first switch. For example, at 406, the second terminal of the resistor 140 is electrically coupled to the input terminal of the switch 102, as described above.

At 408, a second terminal of the first capacitor to is electrically coupled to the first switch. For example, at 408, the second terminal of the capacitor 142 is electrically coupled to the input terminal of the switch 102, as described above. The acts performed in blocks 402 to 408 may be performed simultaneously.

Figure 5:
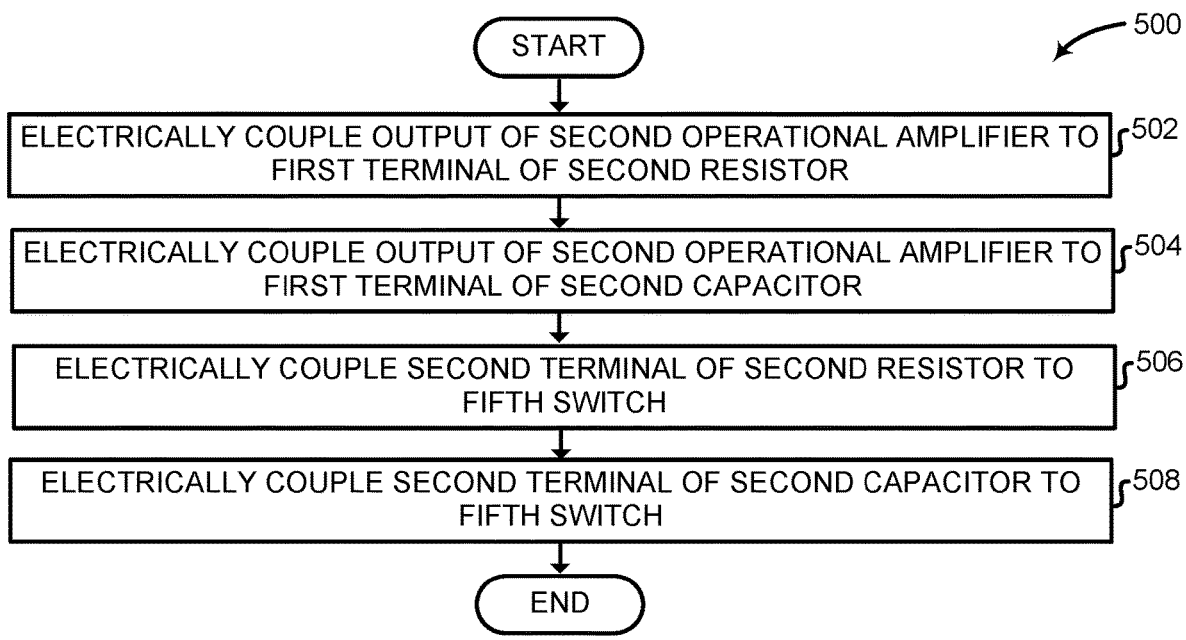
FIG. 5 shows a flowchart of a method, according to one or more embodiments of the present disclosure.

FIG. 5 shows a flowchart of a method 500, according to one or more embodiments of the present disclosure. The method 500 corresponds to block 338 of the method 300 described above.

At 502, the output of the second operational amplifier is electrically coupled to a first terminal of a second resistor. For example, at 502, the output terminal of the operational amplifier 130 is electrically coupled to the first terminal of the resistor 148, as described above.

At 504, the output of the second operational amplifier is electrically coupled to a first terminal of a second capacitor. For example, at 504, the output terminal of the operational amplifier 130 is electrically coupled to the first terminal of the capacitor 150, as described above.

At 506, the second terminal of the second resistor is electrically coupled to the fifth switch. For example, at 506, the second terminal of the resistor 148 is electrically coupled to the input terminal of the switch 110, as described above.

At 508, the second terminal of the second capacitor is electrically coupled to the fifth switch. For example, at 508, the second terminal of the capacitor 152 is electrically coupled to the input terminal of the switch 110, as described above. The acts performed in blocks 502 to 508 may be performed simultaneously.

The various embodiments described above can be combined to provide further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A pulse width modulation (PWM) digital-to-analog conversion (DAC) circuit, comprising:
   a first operational amplifier including a first input terminal, a second input terminal, and an output terminal, wherein a voltage level at the output terminal is based on a voltage level at the second input terminal, and wherein the first input terminal is electrically coupled to a first reference voltage;
   a second operational amplifier including a first input terminal, a second input terminal, and an output terminal, wherein a voltage level at the output terminal is based on a voltage level at the second input terminal, and wherein the first input terminal is electrically coupled to a second reference voltage;
   a third operational amplifier including a first input terminal, a second input terminal, and an output terminal, wherein a voltage level at the output terminal is based on a voltage level at the first input terminal and a voltage level at the second input terminal, wherein the output terminal is electrically coupled to the second input terminal;
   a first switching network which, in operation, electrically couples the output terminal of the first operational amplifier to the first input terminal of the third operational amplifier when the first switching network is in a conducting state, and decouples the output terminal of the first operational amplifier from the first input terminal of the third operational amplifier when the first switching network is in a non-conducting state, wherein a first input signal is provided to the first switching network and the first switching network switches between the conducting state and the non-conducting state based on the first input signal;
   a second switching network which, in operation, electrically couples the output terminal of the first operational amplifier to the output terminal of the third operational amplifier when the second switching network is in a conducting state, and decouples the output terminal of the first operational amplifier from the output terminal of the third operational amplifier when the second switching network is in a non-conducting state, wherein a second input signal is provided to the second switching network and the second switching network switches between the conducting state and the non-conducting state based on the second input signal;
   a third switching network which, in operation, electrically couples the output terminal of the second operational amplifier to the first input terminal of the third operational amplifier when the third switching network is in a conducting state, and decouples the output terminal of the second operational amplifier from the first input terminal of the third operational amplifier when the third switching network is in a non-conducting state, wherein the second input signal is provided to the third switching network and the third switching network switches between the conducting state and the non-conducting state based on the second input signal; and
   a fourth switching network which, in operation, electrically couples the output terminal of the second operational amplifier to the output terminal of the third operational amplifier when the fourth switching network is in a conducting state, and decouples the output terminal of the second operational amplifier from the output terminal of the third operational amplifier when the fourth switching network is in a non-conducting state, wherein the first input signal is provided to the fourth switching network and the fourth switching network switches between the conducting state and the non-conducting state based on the first input signal.

2. The PWM DAC circuit according to claim 1, further comprising:
   filter circuitry electrically coupled to the first input terminal of the third operational amplifier,
   wherein the first switching network, in operation, electrically couples the output terminal of the first operational amplifier to an input of the filter circuitry when the first switching network is in the conducting state, and decouples the output terminal of the first operational amplifier from the input of the filter circuitry when the first switching network is in the non-conducting state, and
   wherein the third switching network, in operation, electrically couples the output terminal of the second operational amplifier to the input of the filter circuitry when the third switching network is in the conducting state, and decouples the output terminal of the second operational amplifier from the input of the filter circuitry when the third switching network is in the non-conducting state.

3. The PWM DAC circuit according to claim 2 wherein the filter circuitry includes:
   a first resistor including a first terminal electrically coupled to the input of the filter circuitry, and a second terminal electrically coupled to the first input terminal of the third operational amplifier; and
   a capacitor including a first terminal electrically coupled to the second terminal of the resistor and to the first input terminal of the third operational amplifier, and a second terminal electrically coupled to a ground terminal.

4. The PWM DAC circuit according to claim 1 wherein:
   the first switching network and the fourth switching network are in the conducting state while the second switching network and the third switching network are in the non-conducting state, and
   the first switching network and the fourth switching network are in the non-conducting state while the second switching network and the third switching network are in the conducting state.

5. The PWM DAC circuit according to claim 1 wherein:
   the first input signal and the second input signal are pulse wave modulated signals,
   the first input signal has a first voltage level during a first time period, and has a second voltage level during a second time period,
   the first voltage level is greater than the second voltage level,
   the first time period is different from the second time period, and
   the second input signal has the first voltage level during the second time period, and has the second voltage level during the first time period.

6. A pulse width modulation (PWM) digital-to-analog conversion (DAC) circuit, comprising:
   filter circuitry;
   a first operational amplifier including a first input terminal, a second input terminal, and an output terminal, wherein a voltage level at the output terminal is based on a voltage level at the first input terminal and a voltage level at the second input terminal, and wherein the first input terminal is electrically coupled to an output of the filter circuitry, and the output terminal is electrically coupled to the second input terminal;
a first switch including a control terminal, a first terminal, and a second terminal, wherein the first switch electrically controls whether the first terminal is electrically coupled to the second terminal based on a voltage level at the control terminal, and wherein the control terminal is electrically coupled to a first input signal, and the second terminal is electrically coupled to an input of the filter circuitry;
a second switch including a control terminal, a first terminal, and a second terminal, wherein the second switch electrically controls whether the first terminal is electrically coupled to the second terminal based on a voltage level at the control terminal, and wherein the control terminal is electrically coupled to the first input signal, and the second terminal is electrically coupled to the input of the filter circuitry;
a second operational amplifier including a first input terminal, a second input terminal, and an output terminal, wherein a voltage level at the output terminal is based on a voltage level at the second input terminal, and wherein the output terminal is electrically coupled to the first terminal of the first switch, and the first input terminal is electrically coupled to a first reference voltage;
a third switch including a control terminal, a first terminal, and a second terminal, wherein the third switch electrically controls whether the first terminal is electrically coupled to the second terminal based on a voltage level at the control terminal, and wherein the control terminal is electrically coupled to a second input signal, the first terminal is electrically coupled to the output terminal of the second operational amplifier, and the second terminal is electrically coupled to the first terminal of the second switch and to the second input terminal of the second operational amplifier;
a fourth switch including a control terminal, a first terminal, and a second terminal, wherein the fourth switch electrically controls whether the first terminal is electrically coupled to the second terminal based on a voltage level at the control terminal, and wherein the control terminal is electrically coupled to the second input signal, the first terminal is electrically coupled to the second terminal of the third switch, and the second terminal is electrically coupled to the output terminal of the first operational amplifier;
a fifth switch including a control terminal, a first terminal, and a second terminal, wherein the fifth switch electrically controls whether the first terminal is electrically coupled to the second terminal based on a voltage level at the control terminal, and wherein the control terminal is electrically coupled to the second input signal, and the second terminal is electrically coupled to the input of the filter circuitry;
a sixth switch including a control terminal, a first terminal, and a second terminal, wherein the sixth switch electrically controls whether the first terminal is electrically coupled to the second terminal based on a voltage level at the control terminal, and wherein the control terminal is electrically coupled to the second input signal, and the second terminal is electrically coupled to the input of the filter circuitry;
a third operational amplifier including a first input terminal, a second input terminal, and an output terminal, wherein a voltage level at the output terminal is based on a voltage level at the second input terminal, and wherein the output terminal is electrically coupled to the first terminal of the fifth switch, and the first input terminal is electrically coupled to a second reference voltage;
a seventh switch including a control terminal, a first terminal, and a second terminal, wherein the seventh switch electrically controls whether the first terminal is electrically coupled to the second terminal based on a voltage level at the control terminal, and wherein the control terminal is electrically coupled to the first input signal, the first terminal is electrically coupled to the output terminal of the third operational amplifier, and the second terminal is electrically coupled to the first terminal of the sixth switch and to the second input terminal of the third operational amplifier; and
an eighth switch including a control terminal, a first terminal, and a second terminal, wherein the eighth switch electrically controls whether the first terminal is electrically coupled to the second terminal based on a voltage level at the control terminal, and wherein the control terminal is electrically coupled to the first input signal, the first terminal is electrically coupled to the second terminal of the seventh switch, and the second terminal is electrically coupled to the output terminal of the first operational amplifier.

7. The PWM DAC circuit according to claim 6 wherein:
the first input terminal of the first operational amplifier is a non-inverting input terminal,
the second input terminal of the first operational amplifier is an inverting input terminal,
the first input terminal of the second operational amplifier is a non-inverting input terminal,
the second input terminal of the second operational amplifier is an inverting input terminal,
the first input terminal of the third operational amplifier is a non-inverting input terminal, and
the second input terminal of the third operational amplifier is an inverting input terminal.

8. The PWM DAC circuit according to claim 6 wherein the filter circuitry includes;
a first resistor including a first terminal electrically coupled to the input of the filter circuitry, and a second terminal electrically coupled to the output of the filter circuitry; and
a capacitor including a first terminal electrically coupled to the second terminal of the resistor and to the output of the filter circuitry, and a second terminal electrically coupled to a ground terminal.

9. The PWM DAC circuit according to claim 8, further comprising:
a second resistor including a first terminal electrically coupled to the second terminal of the fourth switch, and a second terminal electrically coupled to the output terminal of the first operational amplifier; and
a third resistor including a first terminal electrically coupled to the second terminal of the eighth switch, and a second terminal electrically coupled to the output terminal of the first operational amplifier,
wherein a resistance of the first resistor is equal to a resistance of the second resistor and is equal to a resistance of the third resistor.

10. The DAC circuit according to claim 6, further comprising:
a first resistor including a first terminal electrically coupled to the output terminal of the second operational amplifier, and a second terminal electrically coupled to the first terminal of the first switch and to the first terminal of the third switch;
a first capacitor including a first terminal electrically coupled to the output terminal of the second operational amplifier, and a second terminal electrically coupled to the first terminal of the first switch and to the first terminal of the third switch;
a second resistor including a first terminal electrically coupled to the output terminal of the third operational amplifier, and a second terminal electrically coupled to the first terminal of the fifth switch and to the first terminal of the seventh switch;
a second capacitor including a first terminal electrically coupled to the output terminal of the third operational amplifier, and a second terminal electrically coupled to the first terminal of the fifth switch and to the first terminal of the seventh switch.

11. The PWM DAC circuit according to claim 6 wherein the first input signal and the second input signal are pulse wave modulated signals.

12. The PWM DAC circuit according to claim 11 wherein:
the first input signal has a first voltage level during a first time period, and has a second voltage level during a second time period,
the first voltage level is greater than the second voltage level,
the first time period is different from the second time period, and
the second input signal has the first voltage level during the second time period, and has the second voltage level during the first time period.

13. The PWM DAC circuit according to claim 6 wherein the first reference voltage and the second reference voltage have a same magnitude and opposite polarities.

14. A method, comprising:
controlling a first switch based on a first input signal;
controlling a second switch based on the first input signal;
controlling a third switch based on a second input signal;
controlling a fourth switch based on the second input signal;
controlling a fifth switch based on the second input signal;
controlling a sixth switch based on the second input signal;
controlling a seventh switch based on the first input signal;
controlling an eighth switch based on the first input signal;
electrically coupling a first reference voltage to a first input of a first operational amplifier;
electrically coupling a second reference voltage to a first input of a second operational amplifier;
electrically coupling an output of filter circuitry to a first input of a third operational amplifier;
electrically coupling an output of the third operational amplifier to a second input of the third amplifier;
electrically coupling an output of the first operational amplifier to an input of the filter circuitry via the first switch when the first switch is in a conducting state;
electrically coupling the output of the first operational amplifier to a second input of the first operational amplifier via the first switch and the second switch when the first switch and the second switch are in a conducting state;
electrically coupling an output of the second operational amplifier to a second input of the second operational amplifier via the seventh switch when the seventh switch is in a conducting state;
electrically coupling the output of the second operational amplifier to the output of the third operational amplifier via the seventh switch and the eighth switch when the seventh switch and the eighth switch are in a conducting state;
electrically coupling the output of the first operational amplifier to the second input of the first operational amplifier via the third switch when the third switch is in a conducting state;
electrically coupling the output of the first operational amplifier to the output of the third operational amplifier via the third switch and the fourth switch when the third switch and the fourth are in a conducting state;
electrically coupling the output of the second operational amplifier to the input of the filter circuitry via the fifth switch when the fifth switch is in a conducting state; and
electrically coupling the output of the second operational amplifier to the second input of the second operational amplifier via the fifth switch and the sixth switch when the fifth switch and the sixth switch are in a conducting state.

15. The method according to claim 14 wherein:
the electrically coupling the output of the first operational amplifier to the input of the filter circuitry via the first switch is performed during a first time period,
the electrically coupling the output of the first operational amplifier to the second input of the first operational amplifier via the first switch and the second switch is performed during the first time period,
the electrically coupling the output of the second operational amplifier to the second input of the second operational amplifier via the seventh switch is performed during the first time period,
the electrically coupling the output of the second operational amplifier to the output of the third operational amplifier via the seventh switch and the eighth switch is performed during the first time period,
the electrically coupling the output of the first operational amplifier to the second input of the first operational amplifier via the third switch is performed during a second time period, the second time period being different from the first time period;
the electrically coupling the output of the first operational amplifier to the output of the third operational amplifier via the third switch and the fourth switch is performed during the second time period;
the electrically coupling the output of the second operational amplifier to the second input of the second operational amplifier via the fifth switch and the sixth switch is performed during the second time period, and
the electrically coupling the output of the second operational amplifier to the input of the filter circuitry via the seventh switch is performed during the second time period.

16. The method according to claim 15 wherein the first input signal and the second input signal are pulse width modulated signals.

17. The method according to claim 16 wherein:
the first input signal has a first voltage level during the first time period, and has a second voltage level during the second time period,
the first voltage level is greater than the second voltage level, and
the second input signal has the first voltage level during the second time period, and has the second voltage level during the first time period.

18. The method according to claim 14 wherein:
the filter circuitry includes a first resistor and a capacitor,
the electrically coupling the output of the first operational amplifier to the output of the third operational amplifier via the third switch and the fourth switch includes electrically coupling the output of the first operational amplifier to the output of the third operational amplifier via the third switch, the fourth switch, and a second resistor,
the electrically coupling the output of the second operational amplifier to the output of the third operational amplifier via the seventh switch and the eighth switch includes electrically coupling the output of the second operational amplifier to the output of the third operational amplifier via the seventh switch, the eighth switch, and a third resistor, and
a resistance of the first resistor is equal to a resistance of the second resistor and is equal to a resistance of the third resistor.

19. The method according to claim 14 wherein:
the electrically coupling the output of the first operational amplifier to the input of the filter circuitry via the first switch includes:
electrically coupling the output of the first operational amplifier to a first terminal of a first resistor;
electrically coupling the output of the first operational amplifier to a first terminal of a first capacitor;
electrically coupling a second terminal of the first resistor to the first switch;
electrically coupling a second terminal of the first capacitor to the first switch, and
the electrically coupling the output of the second operational amplifier to the input of the filter circuitry via the fifth switch includes:
electrically coupling the output of the second operational amplifier to a first terminal of a second resistor;
electrically coupling the output of the second operational amplifier to a first terminal of a second capacitor;
electrically coupling a second terminal of the second resistor to the fifth switch; and
electrically coupling a second terminal of the second capacitor to the fifth switch.

20. The method according to claim 14 wherein the positive reference voltage and the negative reference voltage have a same magnitude and opposite polarities.

* * * * *